(12) United States Patent
McQueen et al.

(10) Patent No.: US 8,860,078 B2
(45) Date of Patent: Oct. 14, 2014

(54) SIMPLIFIED DEVICES UTILIZING NOVEL PN-SEMICONDUCTOR STRUCTURES

(75) Inventors: Tyrel M. McQueen, Cockeysville, MD (US); Patrick Cottingham, Baltimore, MD (US); John P. Sheckelton, Baltimore, MD (US); Kathryn Arpino, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 95 days.

(21) Appl. No.: 13/471,017

(22) Filed: May 14, 2012

(65) Prior Publication Data
US 2013/0299780 A1    Nov. 14, 2013

(51) Int. Cl.
*H01L 29/66*    (2006.01)
*H01L 21/8238*    (2006.01)

(52) U.S. Cl.
USPC ............................................ 257/110; 438/208

(58) Field of Classification Search
USPC ............ 257/110, 279, 461, 656; 438/208, 912
See application file for complete search history.

(56) References Cited

U.S. PATENT DOCUMENTS

| | | | | |
|---|---|---|---|---|
| 5,291,274 A | * | 3/1994 | Tamura | 257/30 |
| 2003/0047280 A1 | | 3/2003 | Takayama et al. | |
| 2003/0217805 A1 | | 11/2003 | Takayama et al. | |
| 2012/0138115 A1 | * | 6/2012 | Chen | 136/205 |
| 2012/0273763 A1 | * | 11/2012 | Banerjee et al. | 257/39 |

FOREIGN PATENT DOCUMENTS

EP    0574137 A1    12/1993
EP    0723302 A2    7/1996

OTHER PUBLICATIONS

Liang Fu, C. L. Kane, and E. J. Mete. "Topological Insulators in Three Dimensions," Phys. Rev. Lett. 98, 106803 (2007).
Hsieh, D. Qian, L. Wray, Y. Xia, Y. S. Hor, R. J. Cava & M. Z. Hasan. "A topological Dirac insulator in a quantum spin Hall phase," *Nature* 452, 970-974 (Apr. 24, 2008).
D. Hsieh, Y. Xia, D. Qian, L. Wray, J. H. Dil, F. Meier, J. Osterwalder, L. Patthey, J. G. Checkelsky, N. P. Ong, A. V. Fedorov, H. Lin, A. Bansil, D. Grauer, Y. S. Hor, R. J. Cava & M. Z. Hasan. "A tunable topological insulator in the spin helical Dirac transport regime," *Nature* 460, 1101-1105 (Aug. 27, 2009).
Y. J. Wang, H. Lin, Tanmoy Das, M. Z. Hasan, A. Bansil. Topological insulators in the quaternary chalcogenide compounds and ternary famatinite compounds, New Journal of Physics, vol. 13 , 085017, (Aug. 2011).

(Continued)

*Primary Examiner* — Calvin Lee
(74) *Attorney, Agent, or Firm* — Venable LLP; Henry J. Daley

(57) ABSTRACT

An electronic or electro-optic device includes a p-type semiconductor layer, an n-type semiconductor layer having a region of contact with the p-type semiconductor layer to provide a p-n junction, a first electrical lead in electrical connection with the p-type semiconductor layer, and a second electrical lead in electrical connection with the n-type semiconductor layer. At least one of the p-type and n-type semiconductor layers includes a doped topological-insulator material having an electrically conducting surface, and one of the first and second electrical leads is electrically connected to the electrically conducting surface of the topological-insulator material.

19 Claims, 3 Drawing Sheets

(56) References Cited

OTHER PUBLICATIONS

L. Andrew Wray, Suyang Xu, Madhab Neupane, Yuqi Xia, David Hsieh, Dong Qian, Alexei V. Fedorov, Hsin Lin, Susmita Basak, Yew San Hor, Robert J. Cava, Arun Bansil, M. Zahid Hasan. "Electron dynamics in topological insulator based semiconductor-metal interfaces (topological p-n interface based on Bi2Se3 class).", Phys, Rev. arXiv:1105.4794, (May 24, 2011).

B. Sacepe, J.B. Oostinga, J. Li, A. Ubaldini, N.J.G. Couto, E. Giannini, A.F. Morpurgo. "Gate-tuned normal and superconducting transport at the surface of a topological insulator", Nature Communications, arXiv:1101.2352 (2011).

Hailin Peng, et al., "Topical insulator nanostructures for near-infared transparent flexible electrodes", Nature Chemistry, Feb. 26, 2012, pp. 1-6.

Xuan Wang, et al, Transparent, Conductive Graphene Electrodes for Dye-Sensitized Solar Cells, Nano Letters, vol. 8, No. 1, (2008).

L.B. Zhang, et. al., "Quantum tunneling through planar p-n junctions in HgTe quantum wells", New Journal of Physics, 12:8, (2010).

Jing Wang, et al. "Topical p-n Junction", Phys. Rev., arXiv:1202.1579v1, Feb. 8, 2012.

\* cited by examiner

PRIOR ART

US 8,860,078 B2

SIMPLIFIED DEVICES UTILIZING NOVEL PN-SEMICONDUCTOR STRUCTURES

BACKGROUND

1. Field of Invention

The field of the currently claimed embodiments of this invention relates to electronic and electro-optic devices, and more particularly to simplified electronic and electro-optic devices that utilize novel pn-semiconductor structures.

2. Discussion of Related Art

In conventional pn-junction devices, charge collection from the energy capture or photon sensing surface requires application of a transparent conducting electrode or patterned metal grid. Not only is this costly, but it also reduces device performance, e.g. by blocking some of the incident solar energy in a photovoltaic.

FIG. 1 is a schematic illustration of a conventional photovoltaic cell 100. Such conventional devices typically have a metal electrode 102 that may be part of, or formed on a substrate. The photovoltaic cell 100 has an n-type (or p-type) semiconductor layer 104 formed on the metal electrode 102 and a p-type (or n-type) semiconductor layer 106 formed on the n-type (or p-type) semiconductor layer 104 such that a pn-junction is formed therebetween. A "transparent" electrode 108 is formed on the p-type (or n-type) semiconductor layer 106. The metal electrode 102 is electrically connected to a first electrical lead 110 and the transparent electrode 108 is electrically connected to a second electrical lead 112.

A common material for the transparent electrode 108 is indium tin oxide (ITO) due to its good electrical conductivity and its relatively good transparency. However, even though ITO has relatively good transparency, there is still significant absorption of light. In addition, indium is not very abundant, so it is becoming very expensive and it is becoming more difficult to meet demand. There has thus been a lot of effort directed to developing new materials such as networks of nanowires and/or graphene to replace conventional transparent electrodes. However, to date, all such conventional electrodes have less than adequate transparency and/or conductivity, or are expensive due to base materials and/or manufacturing requirements. Therefore, there remains a need for improved electro-optic and electronic devices.

SUMMARY

An electronic or electro-optic device according to an embodiment of the current invention includes a p-type semiconductor layer, an n-type semiconductor layer having a region of contact with the p-type semiconductor layer to provide a p-n junction, a first electrical lead in electrical connection with the p-type semiconductor layer, and a second electrical lead in electrical connection with the n-type semiconductor layer. At least one of the p-type and n-type semiconductor layers includes a doped topological-insulator material having an electrically conducting surface, and one of the first and second electrical leads is electrically connected to the electrically conducting surface of the topological-insulator material.

BRIEF DESCRIPTION OF THE DRAWINGS

Further objectives and advantages will become apparent from a consideration of the description, drawings, and examples.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Some embodiments of the current invention are directed to electronic or electro-optic devices that use particular semiconducting materials that have metallic surface states that provide electrical conduction on the surface of a pn-junction. Some embodiments of the current invention allow for the collection of charges from electron-hole pair separation processes in photovoltaics and sensors, for example, without requiring the use of transparent or patterned electrical contacts. Use is made of semiconducting materials that by their nature have metallic surface states that 'automatically' act as an electrode. This can, for example, eliminate the use of ITO for transparent electrodes, eliminate the cost associated with forming an electrode, and provide very high transparency since there is no electrode layer for light to pass through. A feature of some embodiments of the current invention is that it includes a pn-junction from materials that are semiconducting in bulk but have metallic surface states due to fundamental topological properties of the materials, thus automatically providing an electrically conducting surface contact.

Figure 1:
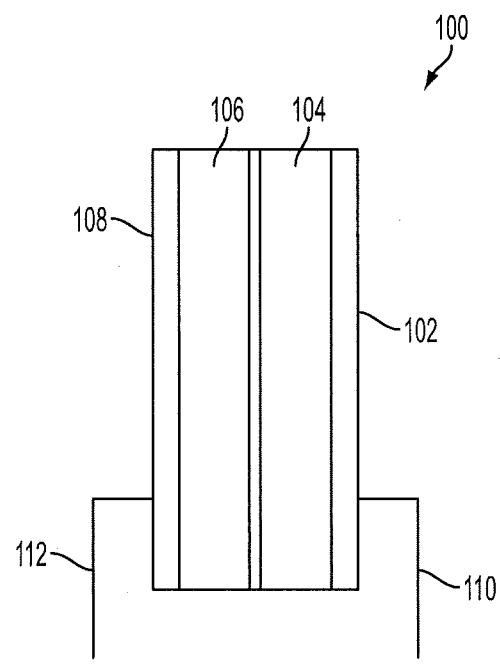
FIG. 1 is a schematic illustration of a conventional photovoltaic device.
Figure 2:
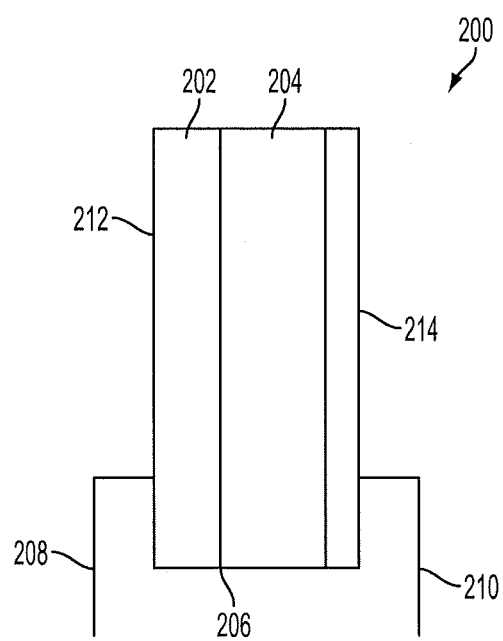
FIG. 2 is a schematic illustration of an electronic or electro-optic device according to an embodiment of the current invention.

FIG. 2 is a schematic illustration of an electronic or electro-optic device 200 according to an embodiment of the current invention. The electronic or electro-optic device 200 includes a p-type semiconductor layer 202, an n-type semiconductor layer 204 having a region of contact with the p-type semiconductor layer 202 to provide a p-n junction 206, a first electrical lead 208 in electrical connection with the p-type semiconductor layer 202, and a second electrical lead 210 in electrical connection with the n-type semiconductor layer 204. (In alternative embodiments, the p-type and n-type semiconductor layers can be exchanged to provide n-type semiconductor layer 202, and p-type semiconductor layer 204. Hereafter, it will be assumed that "p-type" and "n-type" can be exchanged unless indicated otherwise.) At least one of the p-type and n-type semiconductor layers (202, 204) includes a doped topological-insulator material having an electrically conducting surface, and one of the first and second electrical leads (208, 210) is electrically connected to the electrically conducting surface of the topological-insulator material.

In an embodiment, the p-type semiconductor layer 202 can be a p-doped topological-insulator material having an electrically conducting surface 212. In the embodiment of FIG. 2, the n-type semiconductor layer 204 can be a normal semiconductor material, i.e., not a topological-insulator material such that it does not have an electrically conducting surface. In this case, an electrode 214 is in electrical contact with the n-type semiconductor layer 204. The first and second electrical leads (208, 210) provide an electrical connection of the respective conducting surfaces to an electrical circuit. In the case of the normal semiconductor material, an electrode provides the electrically conducting surface, whereas the p-type semiconductor layer 202 has an electrically conducting surface without the need for an electrode. An electrode spans across the surface to collect charge, whereas the lead is a localized electrical connection.

The topological-insulator material can include at least one of $Bi_2(Se/Te)_3$, $Tl(Sb/Bi)(Se/Te)_2$, $Ca_3PbO$, $Bi_xSb_{1-x}$ (x<0.92), $Ag_2Te$ or $(Au/Bi/Sb)Tl_9(Se/Te)_6$, for example. In some embodiments, the doped topological-insulator material can consist essentially of at least one of doped $Bi_2Se_3$ or doped $Bi_xSb_{1-x}$, wherein x<0.92.

The normal semiconductor material can include at least one of Si, Ge, GaAs, CdTe, CdSe, InSb, (Cu/Ag/Au)(In/Ga/Tl)(Se/Te/S)$_2$ (CIS/CIGS), $Sb_2(S/Se)_3$, $Bi_2S_3$, $Tl(Sb/Bi)S_2$, BiTeI, Hg(S/Se/Te), CdS, Zn(S/Se), $In_2(S/Se)_3$, or $Cu_2ZnSn(S/Se)_4$ (CZTS), for example. In some embodiments, the doped normal semiconductor material can consist essentially of at least one of doped HgTe, doped CdSe, doped CIGS, or doped CZTS. However, the materials are not limited to these particular examples. Semiconducting materials that include a high-Z atomic element are often good candidates for potential topological insulators due to the resulting large spin-orbit coupling. It is thus conceivable that new topological insulators may be found in the future. These are considered to be encompassed within the broad scope of the current invention, as well as any currently available materials. In addition, the topological insulators and normal semiconductors can be doped by conventional approaches according to some embodiments of the current invention.

The terms "insulator" and "semiconductor" are not intended to be mutually exclusive terms. A semiconductor is consider to be a type of insulator in which the band gap is relatively small compared to a poor electrical conductor, but large compared to a good electrical conductor such as a metal.

Figure 3:
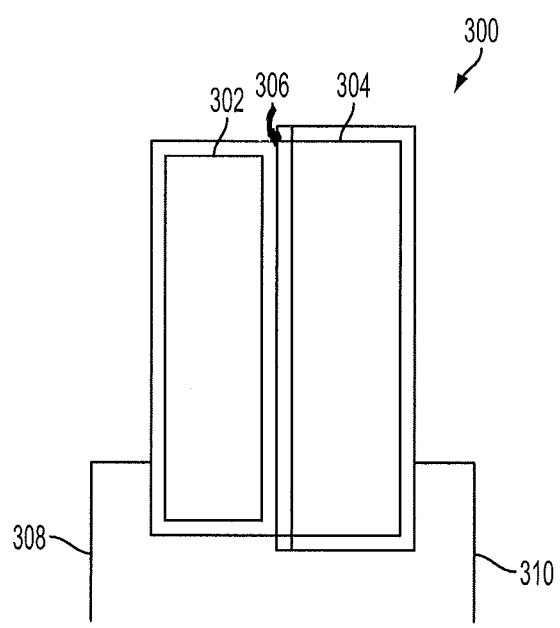
FIG. 3 is a schematic illustration of an electronic or electro-optic device according to another embodiment of the current invention.

FIG. 3 is a schematic illustration of an electronic or electro-optic device 300 according to another embodiment of the current invention. The electronic or electro-optic device 300 includes a p-type semiconductor layer 302, an n-type semiconductor layer 304 having a region of contact with the p-type semiconductor layer 302 to provide a p-n junction 306, a first electrical lead 308 in electrical connection with the p-type semiconductor layer 302, and a second electrical lead 310 in electrical connection with the n-type semiconductor layer 304. (As previously indicated above, the p-type and n-type semiconductor layers can be exchanged to provide n-type semiconductor layer 302, and p-type semiconductor layer 304.) The p-type semiconductor layer 302 includes a first doped topological-insulator material providing a first electrically conducting surface, and the n-type semiconductor layer 304 includes a second doped topological-insulator material providing a second electrically conducting surface. The first and second doped topological-insulator materials can be the same materials in some embodiments, or they can be different materials in other embodiments. Each of the first and second doped topological-insulator materials can be include at least one of $Bi_2(Se/Te)_3$, $Tl(Sb/Bi)(Se/Te)_2$, $Ca_3PbO$, $Bi_xSb_{1-x}$ (x<0.92), $Ag_2Te$ or $(Au/Bi/Sb)Tl_9(Se/Te)_6$, for example.

Topological Insulator behavior results when there are an odd number of band inversions in the Brillouin Zone. If each topological insulator has surface states arising from the same inversion (e.g. inversion of states at the 0 momentum Γ point), then joining the two produces an electrical short-circuit around the pn junction, which may not be useful. But if the band inversions occur at different places in the Brillouin Zone (say Γ for the p-part and L for the n-part) then there can be no charge transport because the two sets of surface states (i.e. there is no short-circuit). In this example of two different topological insulators, there is no need for either electrode since there will be two electrically conducting surfaces that do not result in a short circuit when they are in contact.

In the embodiments of FIGS. 2 and 3, the bulk materials are appropriately charge-doped to produce the pn-junction. The surface states are then being used for their metallic properties so metal contacts are not needed anymore. Another embodiment utilizes the fact that a small gap in the topological surface states (i.e. making them semiconducting), can be achieved by addition of magnetic atoms (for example, but not limited to, Fe, Mn, Co, Ni, and their alloys, Pr, Nd, Ho, Dy, Gd, Er, Eu, and their alloys, etc), or if there is a gradient of these additions, then a pn junction between surface states can be created. This has an advantage of being an entirely surface-driven effect, obviating the need for precise bulk doping control.

The above examples show a single p-type layer and a single n-type layer. However, the invention is not limited by the number of layers. There can be multiple layers in some devices. There can also being additional layers include in the devices such as buffer layers, etc.

The electronic or electro-optic devices can be, but are not limited to, photovoltaic devices, optical sensors, light emitting diodes, transistors, diodes, etc.

EXAMPLES

The following examples are provided to help explain some concepts of the current invention. The broad concepts of the current invention are not limited to these specific examples.

An n-type BiTeI layer on top of a p-type Ca-doped $Bi_2Se_3$ one was successfully prepared.

BiTeI was prepared directly from the elements by placing stoichiometric amount of Bi and Te in a 10×12 mm quartz tube with a 10% excess of $I_2$, which was then sealed off under vacuum and slowly heated to 550 C., held there for 24 hr, and then cooled to room temperature. BiTeI is natively n-type. Single crystals of p-type, Ca-doped $Bi_2Se_3$ was prepared using established literature procedures.

The junction was fabricated using $I_2$-assisted vapor phase transport. A piece of BiTeI and excess $I_2$ were placed in one end of a 10×12 mm quartz tube, and a single crystal of $Bi_2Se_3$ was placed at the other end. It was placed in a tube furnace, with the hot end (BiTeI) at 550 C., and the cold end ($Bi_2Se_3$ crystal) at 300 C., for 30 minutes, and then removed. Visually, a thin film of BiTeI uniformly coated the surface of the $Bi_2Se_3$ crystal. The BiTeI coating was removed from all but one side of the crystal by mechanical polishing to produce a pn junction.

Measurements

Figure 4:
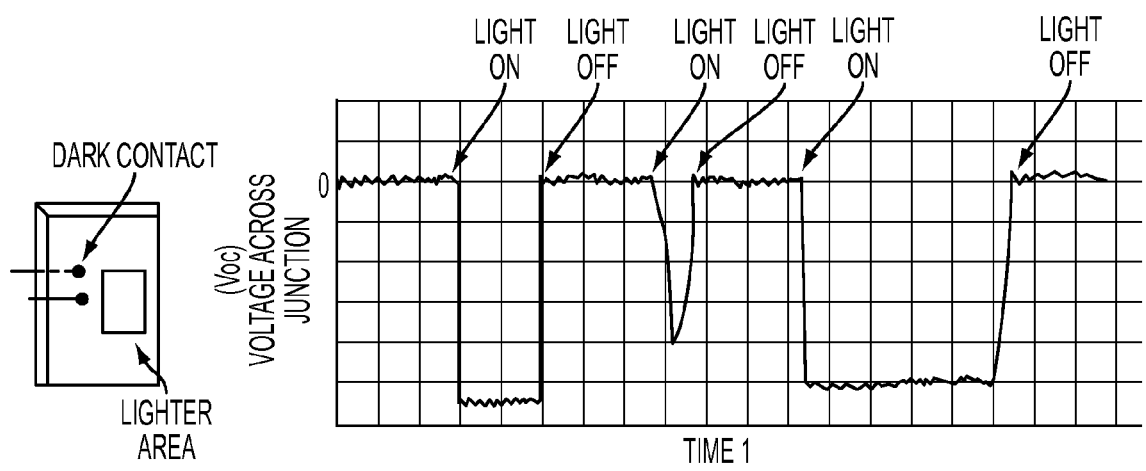
FIG. 4 shows data for a photovoltaic cell according to an embodiment of the current invention.

Thin platinum wires were attached to the pn junction in the appropriate geometry using small amounts of Dupont silver conductive paste that was allowed to cure overnight. The device was then sealed in Cytop epoxy. This device was then mounted on a sample stage of a commercial quantum design physical properties measurement systems, and $V_{OC}$ measurements performed using established techniques, with a white LED flashlight as the light source. FIG. 4 shows the results of $V_{OC}$ measurements as a function of time. This demonstrates that a single electrode photovoltaic cell, i.e., with a conducting topological insulator surface without a transparent electrode, does in fact work.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electronic or electro-optic device, comprising:
    a p-type semiconductor layer;
    an n-type semiconductor layer having a region of contact with said p-type semiconductor layer to provide a p-n junction;
    a first electrical lead in electrical connection with said p-type semiconductor layer; and
    a second electrical lead in electrical connection with said n-type semiconductor layer,
    wherein at least one of said p-type and n-type semiconductor layers comprises a doped topological-insulator material having an electrically conducting surface,
    wherein one of said first and second electrical leads is electrically connected to said electrically conducting surface of said topological-insulator material, and
    wherein said p-type and n-type semiconductor layers are photo-active materials and at least a portion of said electrically conducting surface of said topological-insulator material provides an electrode-less surface for at least one of receiving or transmitting light at an operating wavelength of said electronic or electro-optic device.

2. An electronic or electro-optic device according to claim 1, further comprising an electrode in electrical contact with said layer of normal semiconducting material.

3. An electronic or electro-optic device according to claim 1, wherein said doped topological-insulator material comprises at least one of $Bi_2(Se/Te)_3$, $Tl(Sb/Bi)(Se/Te)_2$, $Ca_3PbO$, $Bi_xSb_{1-x}$ (x<0.92), $Ag_2Te$ or $(Au/Bi/Sb)Tl_9(Se/Te)_6$.

4. An electronic or electro-optic device according to claim 1, wherein said doped topological-insulator material consists essentially of at least one of doped $Bi_2Se_3$ or doped $Bi_xSb_{1-x}$, wherein x<0.92.

5. An electronic or electro-optic device according to claim 1, further comprising a magnetic material proximate said region of contact of said n-type and p-type semiconducting layers, said magnetic material acting to reduce electrical conductivity of a portion of said electrically conducting surface of said topological-insulator material in said region of contact.

6. An electronic or electro-optic device according to claim 1, wherein said doped topological-insulator material consists essentially of at least one of doped $Bi_2Se_3$ or doped $Bi_xSb_{1-x}$, wherein x<0.92.

7. An electronic or electro-optic device according to claim 6, wherein said doped normal semiconductor material comprises at least one of Si, Ge, GaAs, CdTe, CdSe, InSb, $(Cu/Ag/Au)(In/Ga/Tl)(Se/Te/S)_2$ (CIS/CIGS), $Sb_2(S/Se)_3$, $Bi_2S_3$, $Tl(Sb/Bi)S_2$, BiTeI, Hg(S/Se/Te), CdS, Zn(S/Se), $In_2(S/Se)_3$, or $Cu_2ZnSn(S/Se)_4$ (CZTS).

8. An electronic or electro-optic device according to claim 6, wherein said doped normal semiconductor material consists essentially of at least one of doped HgTe, doped CdSe, doped CIGS, or doped CZTS.

9. An electronic or electro-optic device according to claim 1, wherein one of said p-type and n-type semiconductor layers is a layer of a doped topological-insulator material having an electrically conducting surface and one of said p-type and n-type semiconductor layers is a layer of a doped normal semiconductor material without an electrically conducting surface.

10. An electronic or electro-optic device according to claim 9, wherein said doped topological-insulator material comprises at least one of $Bi_2(Se/Te)_3$, $Tl(Sb/Bi)(Se/Te)_2$, $Ca_3PbO$, $Bi_xSb_{1-x}$ (x<0.92), $Ag_2Te$ or $(Au/Bi/Sb)Tl_9(Se/Te)_6$.

11. An electronic or electro-optic device according to claim 10, wherein said doped normal semiconductor material consists essentially of at least one of doped HgTe, doped CdSe, doped CIGS, or doped CZTS.

12. An electronic or electro-optic device according to claim 10, wherein said doped normal semiconductor material comprises at least one of Si, Ge, GaAs, CdTe, CdSe, InSb, $(Cu/Ag/Au)(In/Ga/Tl)(Se/Te/S)_2$ (CIS/CIGS), $Sb_2(S/Se)_3$, $Bi_2S_3$, $Tl(Sb/Bi)S_2$, BiTeI, Hg(S/Se/Te), CdS, Zn(S/Se), $In_2(S/Se)_3$, or $Cu_2ZnSn(S/Se)_4$ (CZTS).

13. An electronic or electro-optic device according to claim 1, wherein said p-type semiconductor layer comprises a first doped topological-insulator material providing a first electrically conducting surface,
    wherein said n-type semiconductor layer comprises a second doped topological-insulator material providing a second electrically conducting surface,
    wherein said first electrical lead is electrically connected to said first electrically conducting surface of said first doped topological-insulator material, and
    wherein said second electrical lead is electrically connected to said second electrically conducting surface of said second doped topological-insulator material to provide an electrode-less electronic or electro-optic device.

14. An electronic or electro-optic device according to claim 13, wherein said first doped topological-insulator material and said second doped topological-insulator material each comprises at least one of $Bi_2(Se/Te)_3$, $Tl(Sb/Bi)(Se/Te)_2$, $Ca_3PbO$, $Bi_xSb_{1-x}$ (x<0.92), $Ag_2Te$ or $(Au/Bi/Sb)Tl_9(Se/Te)_6$.

15. An electronic or electro-optic device according to claim 13, wherein said first doped topological-insulator material and said second doped topological-insulator material each comprises at least one of $Bi_2Se_3$ and $Bi_xSb_{1-x}$,
    wherein x<0.92.

16. An electronic or electro-optic device according to claim 13, wherein said first doped topological-insulator material and said second doped topological-insulator material are different materials having quantum-mechanically distinguishable surface conducting states.

17. An electronic or electro-optic device according to claim 13, further comprising a magnetic material proximate said region of contact of said n-type and p-type semiconducting layers.

18. An electronic or electro-optic device according to claim 13, wherein said magnetic material includes at least one of Fe, Mn, Co, Ni, and their alloys, Pr, Nd, Ho, Dy, Gd, Er, Eu, and their alloys.

19. An electronic or electro-optic device according to claim 13, wherein said magnetic material includes at least one of Fe, AlNiCo, and Nd.

* * * * *